United States Patent
Ek et al.

(10) Patent No.: US 10,790,835 B2
(45) Date of Patent: Sep. 29, 2020

(54) SYSTEM FOR PHASE CALIBRATION OF PHASE LOCKED LOOP

(71) Applicant: Telefonaktiebolaget LM Ericsson (publ), Stockholm (SE)

(72) Inventors: Staffan Ek, Lund (SE); Tony Påhlsson, Lund (SE); Henrik Sjöland, Lund (SE)

(73) Assignee: Telefonaktiebolaget LM Ericsson (Publ) (SE)

( * ) Notice: Subject to any disclaimer, the term of this patent is extended or adjusted under 35 U.S.C. 154(b) by 0 days.

(21) Appl. No.: 16/489,551

(22) PCT Filed: Mar. 1, 2017

(86) PCT No.: PCT/EP2017/054795
§ 371 (c)(1),
(2) Date: Aug. 28, 2019

(87) PCT Pub. No.: WO2018/157926
PCT Pub. Date: Sep. 7, 2018

(65) Prior Publication Data
US 2020/0014331 A1    Jan. 9, 2020

(51) Int. Cl.
*H03C 3/09* (2006.01)
*G04F 10/00* (2006.01)
(Continued)

(52) U.S. Cl.
CPC ............ *H03L 7/087* (2013.01); *G04F 10/005* (2013.01); *H03L 7/0891* (2013.01); *H03L 7/0992* (2013.01); *H03C 3/0991* (2013.01)

(58) Field of Classification Search
CPC ..... H03L 7/087; H03L 7/0891; H03L 7/0893; H03L 7/0895; H03L 7/0896;
(Continued)

(56) References Cited

U.S. PATENT DOCUMENTS

| 5,142,246 A | 8/1992 | Petersson |
| 6,466,096 B1 | 10/2002 | DeVito |

(Continued)

FOREIGN PATENT DOCUMENTS

| WO | 2008077820 A1 | 7/2008 |
| WO | 2011140713 A1 | 11/2011 |
| WO | 2015047280 A1 | 4/2015 |

OTHER PUBLICATIONS

International Search Report and Written Opinion dated Oct. 30, 2017 for International Application No. PCT/EP2017/054795 filed on Mar. 1, 2017, consisting 13-pages.

(Continued)

*Primary Examiner* — Patrick C Chen
(74) *Attorney, Agent, or Firm* — Christopher & Weisberg, P.A.

(57) ABSTRACT

A system for phase control of a Phased Locked Loop, PLL, is disclosed. The system includes the PLL. The PLL includes an oscillator configured to generate an output signal; a frequency divider configured to generate a feedback signal by dividing the output signal from the oscillator; a first phase detector arrangement configured to output a first control signal to control the oscillator in response to a detection of a phase deviation between a reference signal and the feedback signal. A second phase detector is configured to receive the feedback signal from the frequency divider and the reference signal, and generate an output signal. A phase calibration circuit is configured to receive the output signal from the second phase detector and generate a second control signal to adjust a phase of the output signal of the oscillator.

17 Claims, 7 Drawing Sheets

(51) Int. Cl.
*H03L 7/087* (2006.01)
*H03L 7/089* (2006.01)
*H03L 7/099* (2006.01)

(58) Field of Classification Search
CPC ... H03L 7/0898; H03L 7/0992; H03L 7/0993; H03L 7/0994; H03C 3/0991
See application file for complete search history.

(56) References Cited

U.S. PATENT DOCUMENTS

| | | | |
|---|---|---|---|
| 2006/0158262 A1 | 7/2006 | Robinson et al. | |
| 2011/0298507 A1* | 12/2011 | Jakobsson | H03L 7/07 327/156 |
| 2012/0106689 A1* | 5/2012 | Byun | H03L 7/085 375/374 |
| 2015/0004919 A1* | 1/2015 | Ek | H04L 7/0331 455/75 |
| 2016/0173050 A9* | 6/2016 | Brown | H03D 1/08 329/349 |
| 2016/0202723 A1* | 7/2016 | Herbeck | G06F 1/12 327/142 |
| 2016/0204787 A1* | 7/2016 | Lotfy | H03L 7/085 327/142 |

OTHER PUBLICATIONS

Axholt et al. "A PLL based 12GHz LO Generator with Digital Phase Control in 90nm CMOS"; Electrical and Information Technology, Lund University; IEEE 2009, consisting of 4-pages.

Axholt et al. "A 60GHz Receiver Front-End with PLL based Phase Controlled LO Generation for Phased-Arrays"; Dept. of electrical- and information technology, Lund University; Engineers Australia 2011, consisting of 4-pages.

* cited by examiner

SYSTEM FOR PHASE CALIBRATION OF PHASE LOCKED LOOP

CROSS-REFERENCE TO RELATED APPLICATIONS

This application is a Submission Under 35 U.S.C. § 371 for U.S. National Stage Patent Application of International Application Number: PCT/EP2017/054795, filed Mar. 1, 2017 entitled "SYSTEM FOR PHASE CALIBRATION OF PHASE LOCKED LOOP," the entirety of which is incorporated herein by reference.

TECHNICAL FIELD

Embodiments herein relate to a system for phase calibration of a Phase Locked Loop, PLL. In particular, they relate to phase alignment and correction of a temperature dependent phase drift in the PLL comprised in an electronic circuit or device, such as a wireless communication device.

BACKGROUND

Wireless communication systems usually comprise transceivers which comprise receivers and transmitters. The transmitters typically up-convert baseband signals to Radio Frequency (RF) signals for transmission, and the receivers down-convert received RF signals to baseband signals for processing. Such frequency conversion requires producing reliable mixing frequency signals, typically referred to as local oscillator (LO) signals, for use in an RF Integrated Circuit (RFIC) in a wireless communication device. PLLs are often used to provide such mixing frequency signals.

It is foreseeable that 5G cellular systems will use millimetre waves, where the frequencies currently in discussion range between 15 GHz and 60 GHz. In order to use such 5G system outdoors, a longer cyclic prefix, which is used as a guard band between symbols, has to be used compared to newly released 60 GHz indoor systems. Such longer cyclic prefixes necessitate a closer sub-carrier spacing in the Orthogonal Frequency Division Multiplexing (OFDM) modulation. This closer sub-carrier spacing poses stringent phase noise requirements on the output of the PLLs. At the same time, beamforming should be supported to increase the range and capacity of the system, which results in a large number of antenna elements. The signal at each antenna element of a beamforming system will have an individual phase shift that controls the beam and in particular the beam direction. In some implementations, the beam controlling phase shifts are imposed on the local oscillator signal generated by the PLL. In any event, accurate phase shifts are required to provide accurate beamforming. It is also desirable to be able to program the frequency of the local oscillator signal to enable the wireless communication device to operate on different frequency channels and in different bands. Therefore, implementing local oscillator generation circuitry achieving low phase noise, individually programmable phase, programmable frequency, and distributing the local oscillator signals to all transceivers in a beamforming system, are key challenges without consuming excessive power.

Some solutions for generating the local oscillator signals with phase control have been published, for example, in A. Axholt, H. Sjöland, "*A PLL based 12 GHz LO generator with digital phase control in 90 nm CMOS*", Analog Integrated Circuits and Signal Processing, Vol. 67, No. 3, pp. 309-318, 2011, and A. Axholt, H. Sjöland, "*A 60 GHz receiver front-end with PLL based phase controlled LO generation for phased-arrays*", Analog Integrated Circuits and Signal Processing, Vol. 80, No. 1, pp. 23-32, 2014. In these solutions, each antenna element is connected to a transceiver, and each transceiver receives individual LO signals from a local phase-controlled PLL. All PLLs receive a common lower frequency reference signal in a few gigahertz range. In this way it is enough to distribute the reference signal across an integrated circuit, at much lower power consumption than distributing the LO signal directly. The PLLs will then locally multiply the reference signal to a higher frequency and generate quadrature LO signals. By using a common reference signal, the output signals of the PLLs will be fixed in frequency and phase with respect to each other.

However, in these solutions, the PLL output signal phase will vary over temperature if standard charge pumps are used in the PLLs. The phase may drift about 180 degrees over 100° C. temperature change. It is clear that, due to this temperature dependent phase behaviour, even a smaller temperature gradient will have severe impact on the beamforming system.

Static errors in between the PLLs may be calibrated, but errors due to temperature drift and different temperature at different PLLs are more cumbersome to compensate. The phase errors due to temperature drift could be compensated by rerunning an antenna calibration algorithm, but this is normally a time and resource consuming task, which may involve interrupting ongoing transmission and reception.

SUMMARY

Therefore, it is an object of embodiments herein to provide an improved system for phase control of a PLL.

According to one aspect of embodiments herein, the object is achieved by a system for phase control of a PLL. The system comprises said PLL. Said PLL comprises an oscillator configured to generate an output signal; a frequency divider configured to generate a feedback signal by dividing the output signal from the oscillator; and a first phase detector arrangement configured to output a first control signal to control the oscillator in response to a detection of a phase deviation between a reference signal and the feedback signal. The system further comprises a second phase detector configured to receive the feedback signal from the frequency divider and the reference signal, and generate an output signal. The system further comprises a phase calibration circuit configured to receive the output signal from the second phase detector and generate a second control signal to adjust a phase of the output signal of the oscillator.

According to the embodiments herein, an additional phase detector is used to detect a phase difference between a PLL output signal and a reference signal. A second control signal is then generated from this additional phase detector by a phase calibration circuit. The phase calibration circuit may be implemented by analog or digital circuits to integrate or sum the phase difference over time. The second control signal is used to adjust the phase of the PLL in addition to a first control signal in the PLL. In this way, an additional control loop is formed which may operate slower than the main control loop of the PLL, and can track and correct any remaining phase errors due to temperature drift and any other phase errors due to other causes.

Usually, different transceivers and PLLs may be operating at different temperatures and the temperatures may vary in different ways in different areas of a multi-antenna system.

Therefore, phase error due to temperature drift and different temperature at different PLLs is severe. Using the system according to embodiments herein, the phase offsets between PLL output signal instances are minimized regardless of impairments of analog components of the PLL, such as limited charge pump output impedance and varied charge pump output current over temperature.

The system according to an embodiment herein may calibrate the phase of the PLL continuously or when necessary. The additional control loop may be continuously active and react to disturbances to the phase as soon as they appear and pull the PLL output signal phase back to a wanted position. Doing the calibration or correction in a continuous fashion may be an advantage in that e.g. rapid temperature changes are tracked by the additional control loop. The temperature drift is more often a relatively slow process, so the calibration may be run relatively infrequent, based on either an elapsed time since the last calibration or a detected temperature drift. The system does not add any phase noise to the PLL output when the calibration is not active. For 5G system, which may be a TDD system, the calibration may be run at a time slot between transmit and receive, i.e. the calibration may be run in background without interfering ongoing transmission and reception.

Further, the system according to embodiments herein avoids frequent calibrations of the complete multi-antenna system and re-calibration of transceiver chains which potentially increases the availability for data transmission. This in turn improves the average data rate of the transmission.

The system according to the embodiments herein utilizes the already available reference signal in the PLL for phase calibration which means that routing of additional signals across and between RFICs is not necessary.

The phase offset of the PLL can be controlled by the system according to embodiments herein which secures the performance of the PLL over Process, Voltage and Temperature (PVT) variations.

Thus, embodiments herein provide an improved system for phase control of a PLL.

BRIEF DESCRIPTION OF THE DRAWINGS

Examples of embodiments herein are described in more detail with reference to attached drawings in which.

DETAILED DESCRIPTION

As part of presenting embodiments herein, simple explanations on components and their functions in a PLL are given, and some problems related to the PLL are identified and discussed.

Figure 1A:
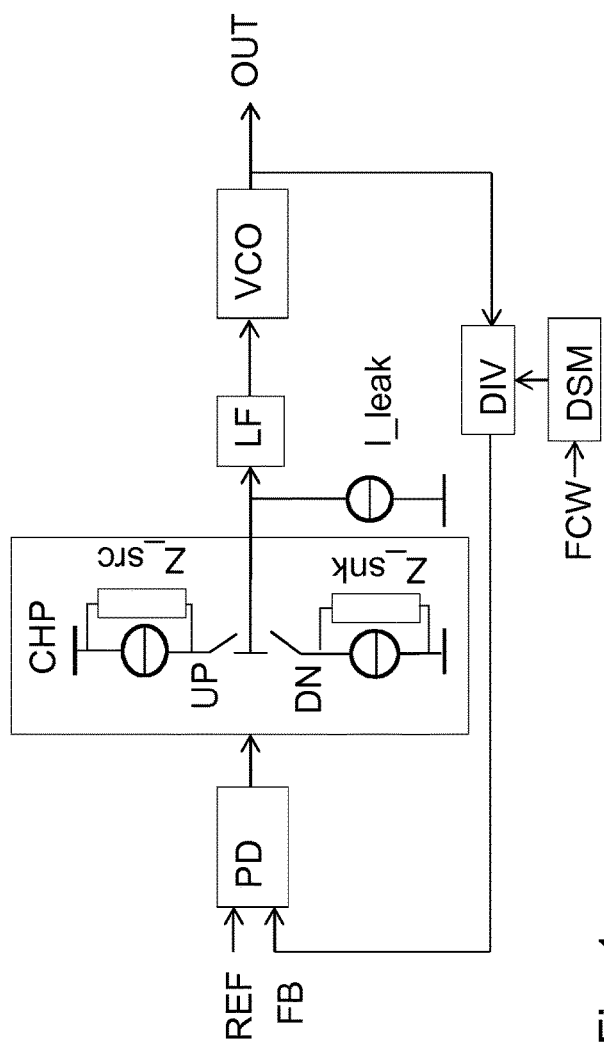
FIGS. 1a and 1b are general block views of PLLs according to prior art.
Figure 1B:
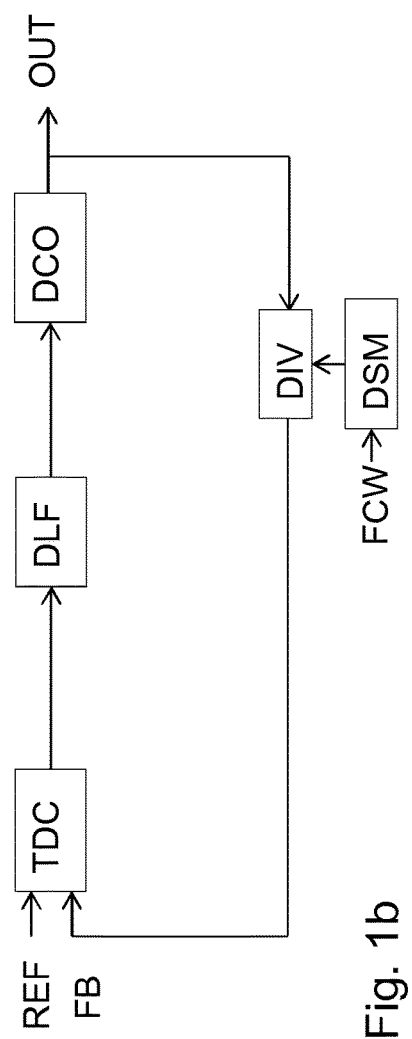

FIGS. 1a and 1b show general block views of two PLLs according to prior art, wherein FIG. 1a is an analog delta-sigma controlled fractional-N PLL and FIG. 1b is a digital PLL. As shown in FIG. 1a, the analog PLL comprises a phase detector PD to receive a reference signal REF and a feedback signal FB and generate a signal indicating a phase difference between the signals REF and FB, a charge pump CHP which receives the signal from the PD and generates a control signal, a loop filter LF to filter the control signal and a voltage controlled oscillator VCO to receive the filtered control signal. The analog PLL further comprises a divider DIV to divide an output signal OUT of the VCO and generate the feedback signal FB. A delta-sigma modulator DSM may receive a frequency control word FCW and controls the divider DIV to make sure the average frequency of the output signal OUT from the PLL is x times that of REF, typically x is in the order of 10 to 100. The delta-sigma modulator DSM adds jitter to the feedback signal FB which is low-pass filtered in the PLL loop filter LF. The loop filter LF generates a control voltage to control the frequency of the VCO, based on the phase difference between the reference signal REF and the feedback signal FB. The VCO is thus phase locked to the reference signal REF.

The digital PLL shown in FIG. 1b works in a similar way as the analog PLL does. The digital PLL comprises a time-to-digital converter TDC instead of the phase detector PD and charge pump CHP. The digital PLL further comprises a digital loop filter DLF to generate digital control words to control a digital controlled oscillator DCO, instead of the analog LF to generate a control voltage to control the VCO.

The PD, CHP and LF in the analog PLL, and the TDC, DLF in the digital PLL are referred to hereafter as a first phase detector arrangement, which is configured to output a first control signal to control the oscillator in response to a detection of a phase deviation between the reference signal REF and the feedback signal FB.

In theory when the PLL is in locked condition, it has a constant output signal phase, no matter other circumstances. However, a typical charge pump PLL has an output signal phase which is sensitive to impairments such as loop filter leakage currents, varying tuning voltage and varied charge pump output current over temperature. The following discussions on impairments in the PLL will use the analog PLL shown in FIG. 1a as an example. Two impairments are shown in FIG. 1a. One is leakage in the loop filter LF, shown as I_leak. This results in an offset of the phase detector and thus a phase difference between the PLL output signal OUT and the reference signal REF.

Another impairment is in the charge-pump CHP output impedance. The finite sink and source output impedances, shown as Z_snk, Z_src, will also impose a phase difference at the PLL input when the control voltage varies.

Both these effects are strongly temperature dependent. The VCO center frequency drifts with temperature and to maintain frequency lock, the PLL compensates this drift by varying the control voltage. The output phase difference of the PLL is equal to the input phase difference multiplied with the PLL division ratio of the divider DIV, making the system very sensitive. Similar problems may occur in the digital PLL as well.

Figure 2:
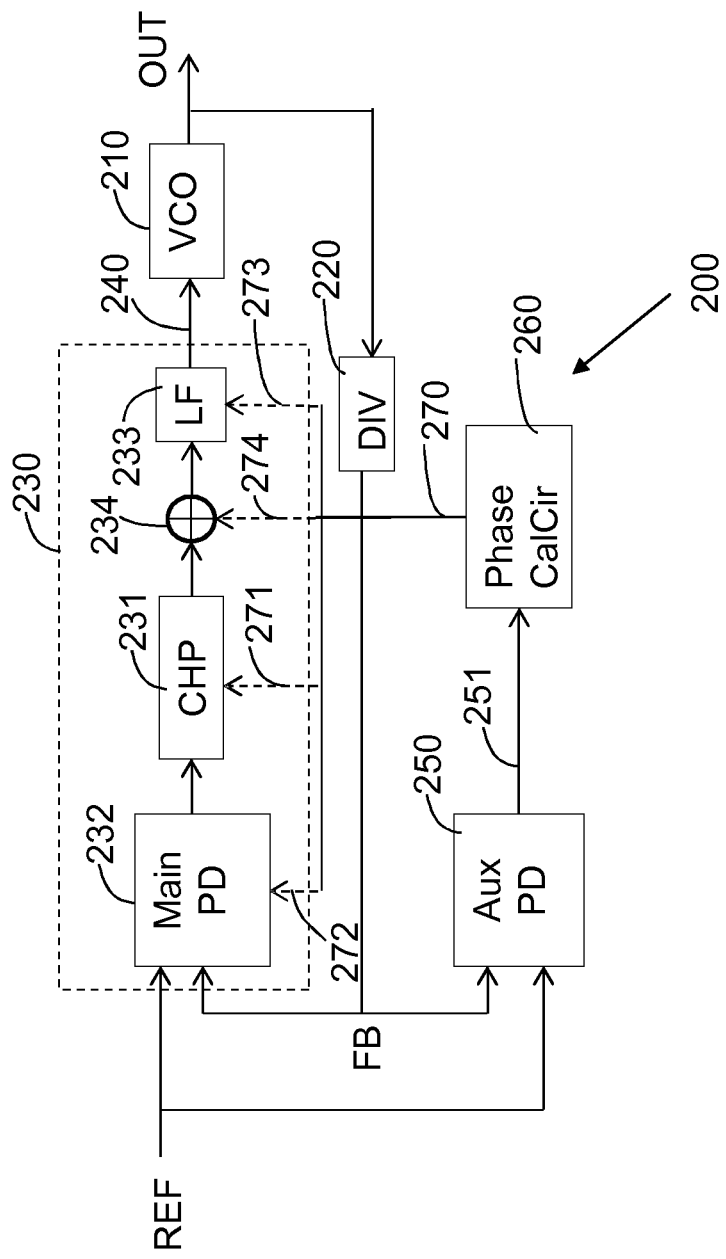
FIG. 2 is a schematic block view illustrating a system according to embodiments herein.

To compensate for the impairments described above, and also phase errors due to other causes, a system 200 according to embodiments herein for phase control of a PLL is shown in FIG. 2.

As shown in FIG. 2, the PLL comprises an oscillator VCO 210 configured to generate an output signal OUT, a frequency divider DIV 220 configured to generate a feedback signal FB by dividing the output signal OUT from the oscillator VCO 210, a first phase detector arrangement 230 configured to output a first control signal 240 to control the oscillator VCO 210 in response to a detection of a phase deviation between a reference signal REF and the feedback signal FB.

The system 200 further comprises a second phase detector AUX PD 250 configured to receive the feedback signal FB from the frequency divider DIV 220 and the reference signal REF, and generate an output signal 251. The system 200 further comprises a phase calibration circuit Phase CalCir 260 configured to receive the output signal 251 from the second phase detector 250 and generate a second control signal 270 to adjust a phase of the output signal of the oscillator VCO 210.

There are several ways of adjusting the output signal phase of the PLL, i.e. the phase of the output signal OUT of the oscillator VCO 210.

According to some embodiments herein, if the PLL is a digital PLL as shown in FIG. 1b, the first phase detector arrangement 230 in the PLL may comprise a time-to-digital converter and a digital loop filter. The time-to-digital converter or the digital loop filter may be configured to receive the second control signal 270 and adjust the phase of the output signal of the oscillator DCO. Alternatively, the second control signal 270 may be added before or after the digital loop filter using phase control circuitry.

According to some embodiments herein, as shown in FIG. 2, the first phase detector arrangement 230 in the PLL may comprise an adjustable charge pump CHP 231. The charge pump CHP 231 may be configured to receive the second control signal 270, denoted by a dotted line 271, and adjust the phase of the output signal of the oscillator VCO 210.

According to some embodiments herein, the first phase detector arrangement 230 in the PLL comprises a phase detector PD 232. The phase detector PD 232 may be configured to receive the second control signal 270, denoted by a dotted line 272, and adjust a phase of the output signal of the oscillator VCO 210.

According to some embodiments herein, the first phase detector arrangement 230 in the PLL comprises a loop filter LF 233. The loop filter LF 233 may be configured to receive the second control signal 270, denoted by a dotted line 273, and adjust a phase of the output signal of the oscillator VCO 210.

According to some embodiments herein, the PLL may further comprise a phase control circuitry 234 configured to receive the second control signal 270 and adjust a phase of the output signal of the oscillator VCO 210. The phase control circuitry 234 may be connected between the charge pump CHP 231 and the loop filter 233, as shown in FIG. 2, to receive the second control signal 270, denoted as a dotted line 274. The phase control circuitry 234 may also be connected between the phase detector PD 232 and the charge pump CHP 231 (not shown) to receive the second control signal 270.

The second phase detector PD 250 may be a binary phase detector. The preferred implementation is a D-flip flop of True Single-Phase Clock (TSPC) type which has a minimum of components that could introduce mismatch deteriorating the phase matching between PLL output instances. In this context this type of phase detector is commonly denoted Bang-Bang or binary phase detector.

According to some embodiments herein, a digital calibrating system may be implemented. In this digital calibration implementation, the output of the second phase detector PD 250, which preferably is of a binary type as discussed above, is connected to a component summing the output values from the binary phase detector PD 250 over time and the sum is compared with a reference value. A decision is taken whether to increase or decrease the second control signal value which may be fed to a phase controlling circuit, e.g. the phase control circuitry 234.

Figure 3A:
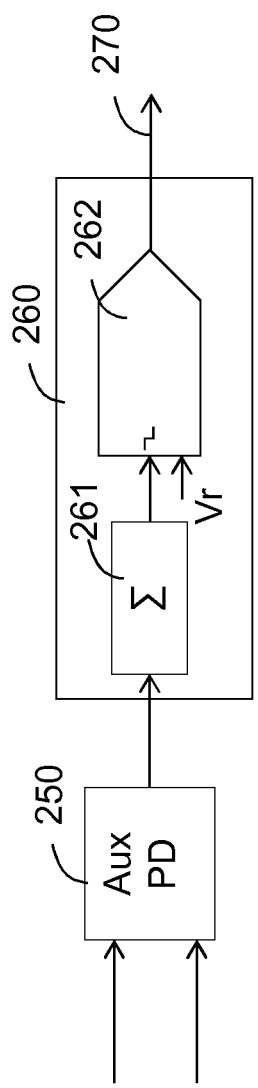
FIGS. 3a and 3b are schematic block views illustrating a phase calibration circuit according to embodiments herein.

FIG. 3a shows a phase calibration circuit 260 according to some embodiments herein to implement a digital calibration. The phase calibration circuit 260 may comprise a summing component 261 configured to sum the output signal from the second phase detector 250 and a comparator 262 configured to compare the sum from the summing component with a reference Vr to generate the second control signal 270.

Figure 4:
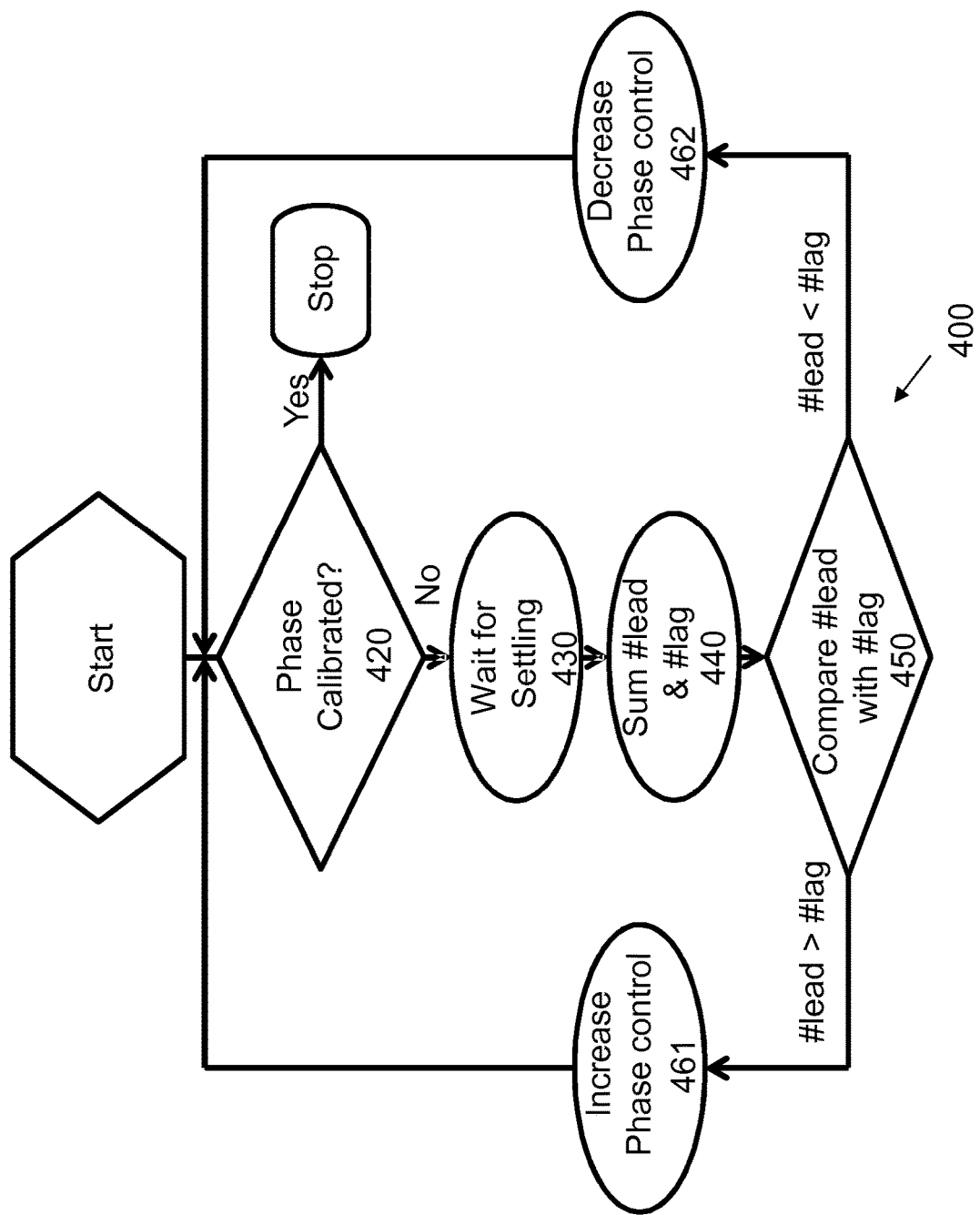
FIG. 4 is a flow chart illustrating a calibration process according to embodiments herein.

According to some embodiments herein, the phase calibration circuit 260 may be configured to perform a calibration process 400 shown in FIG. 4. The phase calibration circuit 260 is configured to monitor, in step 420, whether a phase of the PLL output signal is calibrated. This may be done by monitoring if a certain time has elapsed since the last calibration or receiving an indication indicating a temperature change since the last calibration.

When the phase of the PLL output signal is not calibrated, the phase calibration circuit 260 may wait for settling of the PLL in step 430, i.e. wait until the PLL is settled from the last adjustment or from a start-up of the PLL. Then the phase calibration circuit 260 is configured to sum, in step 440, numbers of samples, e.g. with logical value of 1, i.e. # lead, from the second phase detector 250, and numbers of samples, e.g. with logical value of zero, i.e. # lag, from the second phase detector 250, for a predefined time period.

The phase calibration circuit 260 is further configured to compare, in step 450, the numbers of samples with logical value of zero, # lag, with the numbers of samples with logical value of 1, # lead, and adjust, in step 461, 462, the second control signal 270 based on a result of the comparison.

For example, when the numbers of samples with logical value of 1 is larger than the numbers of samples with logical value of 0, i.e. # lead># lag, the phase calibration circuit 260 increases, in step 461, the second phase control signal; when the numbers of samples with logical value of 1 is smaller than the numbers of samples with logical value of 0, i.e. # lead<# lag, the phase calibration circuit 260 decreases, in step 462, the second phase control signal 270. Depending on the characteristics of the binary phase detector 250, increase or decrease the second control signal 270 could be the other way around.

In this calibration process, the second phase detector 250 output is connected to a summing component 261, which is necessary especially in a fractional-N PLL where the phase relationship has a large momentarily variation. It is the average phase relationship that needs to be calibrated. The sums may be compared with a reference value or compared with each other. For a full phase alignment, the number of occasions or samples with the reference signal REF leading the feedback signal FB should equal the number of lagging. The sum is used to decide whether to step the phase control signal upwards or downwards. Using a binary search algorithm, the step size is halved for each stage of the algorithm.

The complete calibration process may be repeated whenever possible to assure that temperature gradients and variations do not make the phase drift between PLL instance outputs. Preferably the search for the optimum phase control signal value is done in a binary fashion, but any kind of search algorithm may be used, including those not using just the sign of # lead−# lag, but also the magnitude information.

Some simulations have been performed for the system 200 according to the embodiments herein where a high level model of the PLL was used. In the model an adjustable leakage current from the loop filter input was added to mimic the analog imperfections. The simulations were run using different values for this leakage current. Simulation results show that the accuracy of the output signal phase depends on the resolution of the second phase control signal 270 and how many steps the binary search algorithm takes and on the accuracy of the second phase detector 250. In this case some 15 degrees of output phase variation is shown, limited by the phase control resolution assumed for the model.

If the calibration process is repeated frequently enough, it will reduce the number of components whose temperature sensitivity is important to the output phase down to only the introduced additional phase detector 250 and the circuits, i.e. the divider DIV 220, deriving the feedback signal FB from the output signal OUT. Typically, these circuits are edge triggered components without major influence of e.g. absolute current matching.

A possible variant of the digital calibration process is a repeated calibration using two versions of the feedback signal, one output VCO signal cycle apart to adjust the phase. The two calibrations result in two values for the second phase control signal 270. As the control word vs. phase relationship is linear, the two values could be used for interpolation meaning that the phase of the PLL instances in the multi antenna system could be set individually controlling the beam direction with high accuracy without calibration of the complete system.

The proposed phase calibration system does not add any phase noise to the PLL output when the calibration process is not active. For 5G the current assumption is a TDD system with a time slot between transmit and receive, when the calibration could be performed.

To closely track and correct the output phase relative to the reference introduces another advantage, mainly in DSM fractional-N PLLs. A common way to linearize the transfer of the main PD 232 and CHP 231 to avoid folding of DSM noise is to move away from the non-linear region by leaking current from the loop filter LF 233 introducing a time offset between the reference and feedback signals. The leakage may also vary due to PVT variations, which means that the offset may end up too large causing more charge pump noise and larger spurs than with an optimum offset, or too little causing a non-linear transfer and folded DSM noise.

According to some embodiments herein, the offset between the reference and feedback signal in the first PD 232 can be controlled by using a variant of the feedback signal which is preceding the feedback signal FB input to the first phase detector PD 232 by e.g. two VCO signal cycles. Comparing with a preceding signal in the second PD 250 offsets the feedback signal to the first PD 232 with respect to the reference clock signal REF. The system 200 with its second phase detector 250 will pull in the phase error between its inputs close to zero which means that the offset between the reference and feedback signal in the first PD 232 will be two VCO cycles with high precision and stability over temperature if the calibration is repeated when the temperature changes. With the proposed solution, the offset can be controlled which secures the performance of the PLL over PVT variations.

Another variant of the digital calibration process is to let the phase detection stay active once the phase is calibrated and has started to transfer data. If the summed values from the detection are beyond a certain threshold, a Least Significant Bit (LSB) step of the second phase control signal could be done. To minimize the time for the settling doing the phase adjustment, and thus the time when data cannot be transferred, a pulse with certain width and amplitude generated from e.g. the second control signal 270, may be applied to a dedicated modulation input of the VCO 210 to generate a quick change of output phase, i.e. bypassing the PLL loop filter LF 233.

Therefore, according to some embodiments herein, a continuous calibration process may be implemented in the digital calibration system. Instead of stopping the process when the PLL is calibrated as shown in FIG. 4, the calibration process flow may enter a continuous monitoring of the phase alignment. If the PLL output phase starts to drift away, the comparison of number of leading occasions with lagging occasions from the second phase detector 250 will give an indication of this. If it has drifted enough so that an LSB step of the phase control signal would improve the situation, a delay state waiting for an opportunity to correct for this could be entered. As soon as the system gives the opportunity, the LSB step of the second control signal in the right direction could be done.

Figure 5:
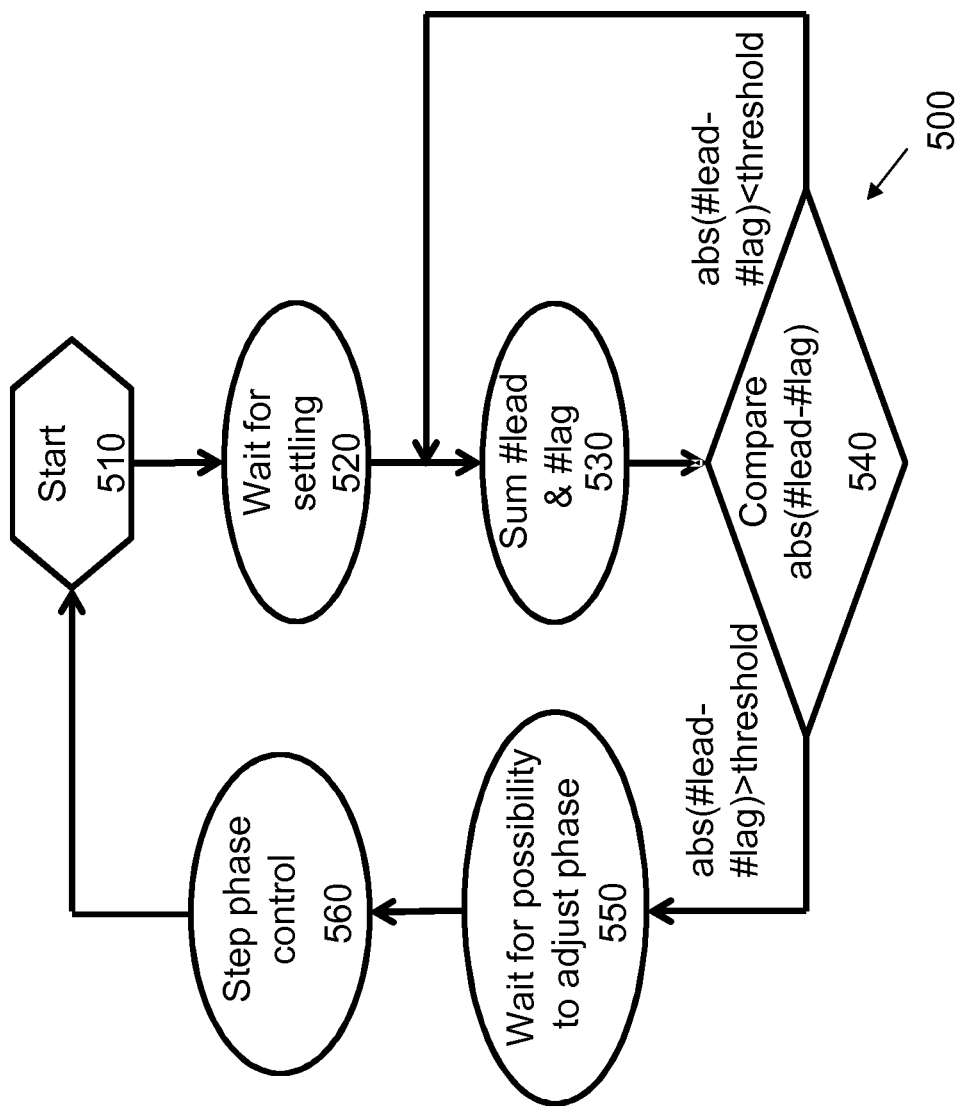
FIG. 5 is a flow chart illustrating a continues calibration process according to embodiments herein.

FIG. 5 shows an example flow chart of a continuous calibration process 500 according to some embodiments herein which may be performed by the phase calibration circuit 260. The continuous calibration process 500 starts with resetting the summing component 261 in step 510, then waiting for settling of the PLL in step 520, i.e. waiting until the PLL is settled from the last adjustment or from a start-up of the PLL. The phase calibration circuit 260 is then configured to sum, in step 530, numbers of samples, e.g. with logical value of 1, i.e. # lead, and numbers of samples, e.g. with logical value of zero, i.e. # lag, from the second phase detector 250, for a predefined time period. The phase calibration circuit 260 is further configured to compare, in step 540, an absolute value of a difference between the numbers of samples with logical value of zero and the numbers of samples with logical value of 1 with a threshold value, i.e. abs(# lead−# lag), and adjust the second control signal by one least significant bit based on a result of the comparison.

For example, when the absolute value of the difference between the numbers of samples with logical value of zero and the numbers of samples with logical value of 1 is larger than a threshold, i.e. abs(# lead−# lag)>threshold, it means that the phase drift is large and needs to be corrected. The phase calibration circuit 260 may be configured to wait for possibility to adjust phase, in step 550, e.g. when there is a time slot where no data transmission is scheduled. Then the phase calibration circuit 260 may be configured to step the phase control signal, in step 560, by one least significant bit. For example, the phase calibration circuit 260 may increase the second phase control signal with one least significant bit when the difference between the numbers of samples with logical value of 1 and the numbers of samples with logical value of zero, is positive, otherwise decrease the second phase control signal by one least significant bit.

Alternatively, if the second phase control signal has high enough resolution that do not disturb the transmission or beam direction significantly when stepping the phase control value, the phase calibration circuit 260 may not need to wait until a time slot when there is no transmission.

After the second phase control signal has been adjusted and applied, the phase calibration circuit 260 is configured to start the calibration process again by resetting the sum to zero, in step 510.

When the absolute value of the difference between the numbers of samples with logical value of zero and the numbers of samples with logical value of 1 is smaller than a threshold, i.e. abs(# lead−# lag)<threshold, it means that the phase drift is still small and no needs to correct, the phase calibration circuit 260 continues to sum, in step 530, numbers of samples with logical value of 1, # lead, and numbers of samples with logical value of zero, # lag, from the second phase detector 250.

According to some embodiments herein, an analog calibrating system may be implemented. In this analog calibrating system, the second phase detector 250 is a binary flip-flop, in this case implemented with TSPC logic, as in the digital calibration system.

Figure 3B:
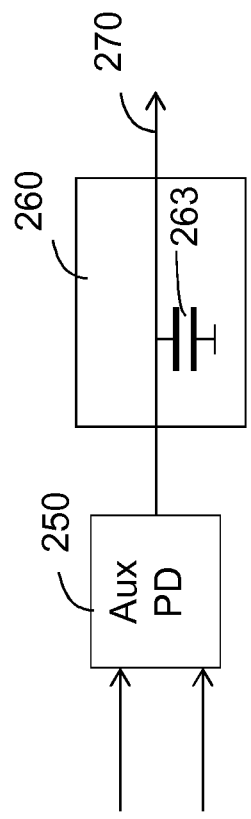

FIG. 3b shows a phase calibration circuit 260 according to some embodiments herein to implement an analog calibration. The second phase detector 250 output is connected to an integrating component 263, e.g. a capacitor. Together with the series output resistance of the second phase detector 250, the capacitor also introduces a pole, which limits the upper frequency where the integration can take place. This enables stability of the whole system 200.

So according to some embodiments herein the phase calibration circuit 260 may comprise an integrating component 263 or a low-pass filter configured to integrate the output signal from the second phase detector 250 to generate the second control signal 270.

Figure 6:
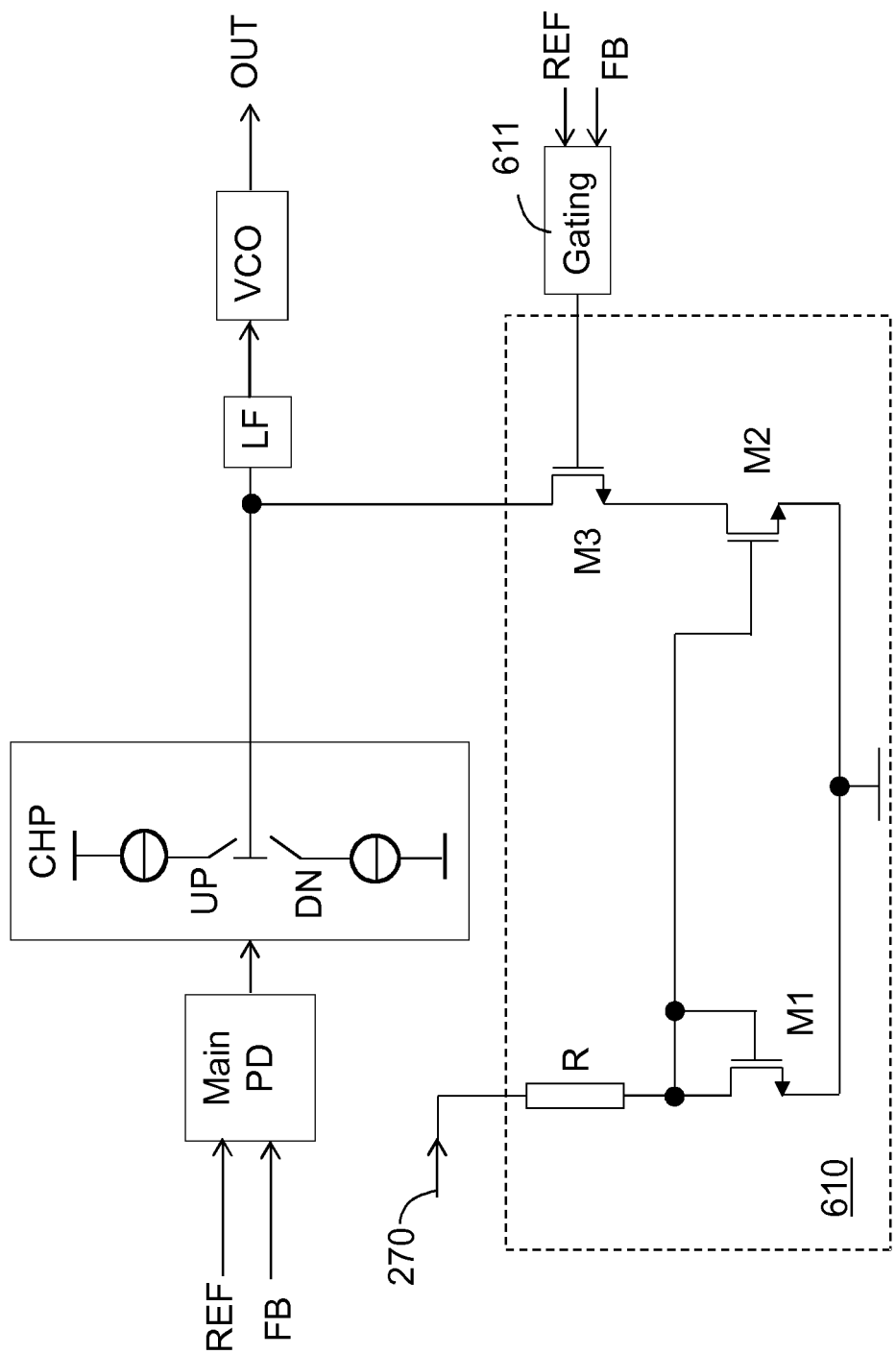
FIG. 6 is a schematic block view illustrating a phase control circuitry according to embodiments herein.

The second control signal 270 may be fed into an additional circuitry e.g. the phase control circuitry 234 to control the phase of the PLL. FIG. 6 shows an additional circuitry 610. The generated voltage from the integrating component 263, i.e. the second control signal 270, is sunk into a resistor R on top of a current mirror comprising transistors M1 and M2, linearizing the transfer from voltage to current drawn from the loop filter LF 233 input node to some extent. Additionally, this implementation may have a gating function 611 which ensures only drawing current from the loop filter LF node during a period of the reference cycle improving noise performance. The gating 511 is realized with a set-reset flip-flop connected to the compare signals FB and REF and with its output connected to a switch M3 on the charge pump output node.

In this analog calibration, instead of summing the output values from the additional phase detector 250 in the digital calibration, the integration is done in analog domain. With proper dimensioning of the integrating function, the additional loop introduced could be continuously active and react to disturbances to the phase as soon as they appear and pull the output phase back to a wanted position e.g. if the temperature has changed and the commonly implemented PLL would have experienced a drifting output phase. Doing the correction in a continuous fashion and not through repeated calibrations could be an advantage in that e.g. rapid temperature changes are tracked by the loop. The above discussed calibration process shown in FIG. 4 may drift in phase between calibrations causing the beam direction to drift.

Simulations have been done for the analog calibration system which show that the PLL internal induced phase variation is minimized to around ~9 degrees phase drifts over 100 degrees C. temperature change, which reduces the need for re-calibration of transceiver chains. As for the digital solution a variant of the feedback signal which is preceding the feedback signal input to the main phase detector PD 232 by two VCO cycles is used. In the simulation, this is done ideally by a high level behavioural model, but in practice it can be done through re-clocking of the frequency divider output with the VCO signal.

Special care is needed for the additional loop introduced not to interfere with the main PLL and not to introduce excessive noise in the PLL output spectrum. In this case the additional loop operation is clearly slower which makes the common loop settle basically unaffected by the additional loop, which follows and corrects the remaining phase error.

To summarise, the main principle of the proposed system 200 for phase control of a PLL is—by introducing another phase detector, i.e. the second phase detector PD 250, to compare the reference signal REF with the PLL output signal, or with some variants of the PLL output signal or several variants of the PLL output signal. The output of the additional phase detector is integrated or summed over time in the phase calibration circuit 250 to generate a second control signal 270 to control the output phase of the PLL. In this way, an additional control loop is formed which may operate slower than the main control loop of the PLL, and can track and correct any remaining phase errors due to temperature drift and any other phase errors due to other causes.

In a 5G multi-antenna system, different types of calibrations to correct for phase and amplitude variations over time will be run in order to have predictable directions for constructive and destructive combinations of signals. In this multi-antenna system using local PLLs at each transceiver, one impairment to correct for is a temperature dependent phase drift. It is assumed that different transceivers and PLLs will be operating at different temperatures and that the temperatures may vary in different ways in different areas of the multi antenna system. Using the system 200 according to embodiments herein, the phase offsets between PLL output signal instances are minimized regardless of impairments of analog components of the PLL, such as limited charge pump output impedance and varied charge pump output current over temperature.

The system 200 according to embodiments herein may calibrate the phase of the PLL continuously or when necessary. The additional control loop may be continuously active and react to disturbances to the phase as soon as they appear and pull the PLL output signal phase back to a wanted position. Doing the calibration or correction in a continuous fashion may be an advantage in that e.g. rapid temperature changes are tracked by the additional control loop.

The temperature drift is more often a relatively slow process, so the calibration may be run relatively infrequent, based on either an elapsed time since the last calibration or a detected temperature drift.

The system does not add any phase noise to the PLL output when the calibration is not active.

The calibration may be run at a time slot between transmit and receive, i.e. the calibration may be run in background without interfering ongoing transmission and reception.

The system and calibrating process according to embodiments herein is simpler than antenna calibration. Thus, when used in a multi-antenna system, it can avoid frequent running of calibration of the complete multi-antenna system and re-calibration of transceiver chains which potentially increase the availability for data transmission. This in turn improves the average data rate of the transmission and enabling the use of individual PLLs for each transceiver.

The system according to embodiments herein can utilizes the already available reference signal in the PLL for phase calibration, provides a relatively low overhead in terms of signal routing.

The phase offset of the PLL can be controlled by the system according to embodiments herein, which secures the performance of the PLL over Process, Voltage and Temperature (PVT) variations.

Figure 7:
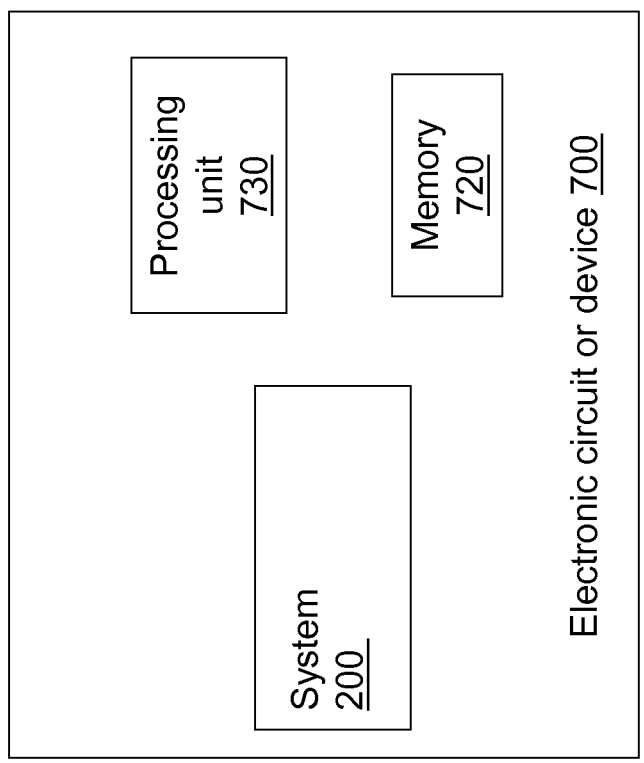
FIG. 7 is a block diagram illustrating an electronic circuit or device in which embodiments herein may be implemented.

The system 200 according to embodiments herein is suitable for phase control of a PLL in an electronic circuit or device. FIG. 7 shows an electronic circuit or device 700 in which the system 200 according to embodiments herein may be implemented. The electronic circuit or device 700 may be any one of a communication device, such as a base station or beamforming base station, a mobile terminal or a user equipment for a cellular communications system, or any one of an electronic circuit, such as a transceiver, a transmitter, a receiver, a frequency synthesiser etc. The electronic circuit or device 800 may comprise other units, e.g. a memory 720 and a processing unit 730 for information storage and signal processing etc.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A system for phase control of a Phased Locked Loop, PLL, the system comprising the PLL,
the PLL including:
an oscillator configured to generate an output signal;
a frequency divider configured to generate a feedback signal by dividing the output signal from the oscillator; and
a first phase detector arrangement configured to output a first control signal to control the oscillator in response to a detection of a phase deviation between a reference signal and the feedback signal; and
the system further comprises:
a second phase detector configured to receive the feedback signal from the frequency divider and the reference signal, and generate an output signal;
a phase calibration circuit configured to receive the output signal from the second phase detector and generate a second control signal to adjust a phase of the output signal of the oscillator; and
the first phase detector arrangement further comprising:
a phase detector and an adjustable charge pump, one of the phase detector and the adjustable charge pump being configured to receive the second control signal and adjust the phase of the output signal of the oscillator; and
a loop filter configured to receive the second control signal and adjust the phase of the output signal of the oscillator.

2. The system according to claim 1, wherein the second phase detector is a binary phase detector.

3. The system according to claim 2, wherein the phase calibration circuit comprises:
a summing component configured to sum the output signal from the second phase detector; and
a comparator configured to compare the sum from the summing component with a reference to generate the second control signal.

4. The system according to claim 2, wherein the phase calibration circuit comprises:
one of an integrating component and a low-pass filter configured to integrate the output signal from the second phase detector to generate the second control signal.

5. The system according to claim 2, wherein the first phase detector arrangement in the PLL comprises a time-to-digital converter and wherein the loop filter is a digital loop filter, wherein one of:
one of the time-to-digital converter and the digital loop filter is configured to receive the second control signal and adjust the phase of the output signal of the oscillator; and
the second control signal is added one of before and after the digital loop filter using a phase control circuitry.

6. The system according to claim 1, wherein the phase calibration circuit comprises:
a summing component configured to sum the output signal from the second phase detector; and
a comparator configured to compare the sum from the summing component with a reference to generate the second control signal.

7. The system according to claim 6, wherein the phase calibration circuit is further configured to perform a calibration process by being configured to:
monitor whether a phase of the PLL output signal is calibrated;
when the phase of the PLL output signal is not calibrated:
sum numbers of samples with logical value of zero and numbers of samples with logical value of 1 from the second phase detector for a predefined time period;
compare the numbers of samples with logical value of zero with the numbers of samples with logical value of 1; and
adjust the second control signal based on a result of the comparison.

8. The system according to claim 7, wherein the phase calibration circuit is further configured to monitor whether a phase of the PLL output signal is calibrated by being configured to one of:
monitor if a certain time has elapsed since the last calibration; and
to receive an indication indicating a temperature change since the last calibration.

9. The system according to claim 6, wherein the phase calibration circuit is further configured to perform a calibration process by being configured to:
sum numbers of samples with logical value of zero and numbers of samples with logical value of 1 from the second phase detector for a predefined time period;
compare an absolute value of a difference between the numbers of samples with logical value of zero and the numbers of samples with logical value of 1 with a threshold value;
adjust the second control signal by one least significant bit based on a result of the comparison; and
reset the sum to zero and repeat the calibration process.

10. The system according to claim 1, wherein the phase calibration circuit comprises:
one of an integrating component and a low-pass filter configured to integrate the output signal from the second phase detector to generate the second control signal.

11. The system according to claim 1, wherein the first phase detector arrangement in the PLL comprises a time-to-digital converter and wherein the loop filter is a digital loop filter, wherein one of:
one of the time-to-digital converter and the digital loop filter is configured to receive the second control signal and adjust the phase of the output signal of the oscillator; and
the second control signal is added one of before and after the digital loop filter using a phase control circuitry.

12. The system according to claim 1, wherein the PLL further comprises a phase control circuitry configured to receive the second control signal and adjust the phase of the output signal of the oscillator, wherein the phase control circuitry is connected one of between a charge pump and the loop filter and between the phase detector and the charge pump comprised in the first phase detector arrangement.

13. A device comprising at least one system for phase control of a Phased Locked Loop, PLL, each system having a PLL,
the PLL including:
an oscillator configured to generate an output signal;
a frequency divider configured to generate a feedback signal by dividing the output signal from the oscillator; and
a first phase detector arrangement configured to output a first control signal to control the oscillator in response to a detection of a phase deviation between a reference signal and the feedback signal; and
the system further comprises:
a second phase detector configured to receive the feedback signal from the frequency divider and the reference signal, and generate an output signal;
a phase calibration circuit configured to receive the output signal from the second phase detector and generate a second control signal to adjust a phase of the output signal of the oscillator; and
the first phase detector arrangement further comprising:
a phase detector and an adjustable charge pump, one of the phase detector and the adjustable charge pump being configured to receive the second control signal and adjust the phase of the output signal of the oscillator; and
a loop filter configured to receive the second control signal and adjust the phase of the output signal of the oscillator.

14. The device according to claim 13, wherein the device is one of a frequency synthesiser, a transceiver, a transmitter, and a receiver.

15. The device according to claim 13, wherein the device is a base station for a cellular communications system.

16. The device according to claim 13, wherein the device is a mobile terminal for a cellular communications system.

17. An electronic circuit comprising at least one system for phase control of a Phased Locked Loop, PLL, each system having a PLL,
the PLL including:
an oscillator configured to generate an output signal;
a frequency divider configured to generate a feedback signal by dividing the output signal from the oscillator; and
a first phase detector arrangement configured to output a first control signal to control the oscillator in response to a detection of a phase deviation between a reference signal and the feedback signal; and
the system further comprises:
a second phase detector configured to receive the feedback signal from the frequency divider and the reference signal, and generate an output signal; and
a phase calibration circuit configured to receive the output signal from the second phase detector and generate a second control signal to adjust a phase of the output signal of the oscillator; and
the first phase detector arrangement further comprising:
a phase detector and an adjustable charge pump, one of the phase detector and the adjustable charge pump being configured to receive the second control signal and adjust the phase of the output signal of the oscillator; and
a loop filter configured to receive the second control signal and adjust the phase of the output signal of the oscillator.

* * * * *